(12) United States Patent
Kida (10) Patent No.: US 9,116,194 B2
(45) Date of Patent: Aug. 25, 2015

(54) CONNECTOR INSPECTION SYSTEM

(75) Inventor: Kousuke Kida, Makinohara (JP)

(73) Assignee: Yazaki Corporation, Tokyo (JP)

( * ) Notice: Subject to any disclaimer, the term of this patent is extended or adjusted under 35 U.S.C. 154(b) by 325 days.

(21) Appl. No.: 13/810,790

(22) PCT Filed: Jul. 20, 2011

(86) PCT No.: PCT/JP2011/067013
§ 371 (c)(1),
(2), (4) Date: Jan. 17, 2013

(87) PCT Pub. No.: WO2012/011603
PCT Pub. Date: Jan. 26, 2012

(65) Prior Publication Data
US 2013/0120000 A1   May 16, 2013

(30) Foreign Application Priority Data

Jul. 20, 2010  (JP) .................................. 2010-163085

(51) Int. Cl.
*G01R 27/26* (2006.01)
*G01R 31/04* (2006.01)
*H01R 13/193* (2006.01)
*H01R 13/641* (2006.01)
(Continued)

(52) U.S. Cl.
CPC .............. *G01R 31/04* (2013.01); *H01R 13/193* (2013.01); *H01R 13/641* (2013.01); *H01R 43/22* (2013.01); *H01R 13/4223* (2013.01)

(58) Field of Classification Search
CPC .... H01R 13/193; H01R 43/22; H01R 13/641; H01R 13/4223; G01R 31/04
USPC .................................................. 324/538, 661
See application file for complete search history.

(56) References Cited

U.S. PATENT DOCUMENTS 4,806,123 A * 2/1989 Konishi et al. ................ 439/595
5,462,449 A * 10/1995 Tsuji et al. .................... 439/188
(Continued)

FOREIGN PATENT DOCUMENTS

CN    1466247 A   1/2004
CN    2686146 Y   3/2005
(Continued)

OTHER PUBLICATIONS

International Search Report dated Oct. 11, 2011 from the International Searching Authority in counterpart application No. PCT/JP2011/067013.

(Continued)

*Primary Examiner* — Benjamin M Baldridge
(74) *Attorney, Agent, or Firm* — Sughrue Mion, PLLC (57) ABSTRACT

There is provided a connector inspection system. A connector housing to be inspected includes reference flat surfaces formed by straight extending in an insertion direction of a connecting terminal in a top side outer peripheral region of a terminal receiving part so as not to overlap with a mounting range of a packing attachment surface, and an inspection jig includes guide flat surfaces for slidably making surface contact with the reference flat surfaces in the case of inserting a detecting pin into a hole for inspection of the connector housing, and a position and a direction of insertion of the inspection jig into the connector housing are regulated by sliding contact between the reference flat surfaces and the guide flat surfaces.

2 Claims, 13 Drawing Sheets (51) Int. Cl.
*H01R 43/22* (2006.01)
*H01R 13/422* (2006.01)

(56) References Cited

U.S. PATENT DOCUMENTS

| | | | |
|---|---|---|---|
| 5,512,833 A | 4/1996 | Fukuda et al. | |
| 5,614,820 A * | 3/1997 | Aoyama et al. | 324/754.14 |
| 5,701,079 A | 12/1997 | Yagi et al. | |
| 5,839,914 A | 11/1998 | Watanabe et al. | |
| 5,877,622 A | 3/1999 | Aoyama et al. | |
| 6,375,502 B2 * | 4/2002 | Yoshida et al. | 439/595 |
| 2001/0003076 A1 | 6/2001 | Kodama | |
| 2001/0003686 A1 * | 6/2001 | Yoshida et al. | 439/595 |
| 2002/0016102 A1 * | 2/2002 | Saba | 439/188 |
| 2002/0170174 A1 * | 11/2002 | Endo et al. | 29/876 |
| 2003/0228795 A1 * | 12/2003 | Ichida et al. | 439/595 |
| 2005/0032424 A1 | 2/2005 | Ichida et al. | |
| 2006/0141845 A1 * | 6/2006 | Hu et al. | 439/350 |
| 2010/0203756 A1 * | 8/2010 | Omori et al. | 439/507 |

FOREIGN PATENT DOCUMENTS

| | | |
|---|---|---|
| EP | 0654856 A2 | 5/1995 |
| JP | 63-193471 A | 8/1988 |
| JP | 7296931 A | 11/1995 |

OTHER PUBLICATIONS

Written Opinion dated Oct. 11, 2011 from the International Searching Authority in counterpart application No. PCT/JP2011/067013.
Office Action dated Jun. 24, 2014 issued by the Japanese Patent Office in corresponding Japanese Application No. 2010-163085.
Office Action dated Sep. 28, 2014, issued by the State Intellectual Property Office of the People's Republic of China in counterpart Chinese Application No. 201180035636.4.

* cited by examiner

FIG. 13 ical Field

CONNECTOR INSPECTION SYSTEM

TECHNICAL FIELD

The present invention relates to a connector inspection system for detecting whether or not an attachment state of a connecting terminal in a waterproof connector housing in which packing is attached to the proximal end side outer periphery of a terminal receiving part is proper.

BACKGROUND ART

Figure 10:
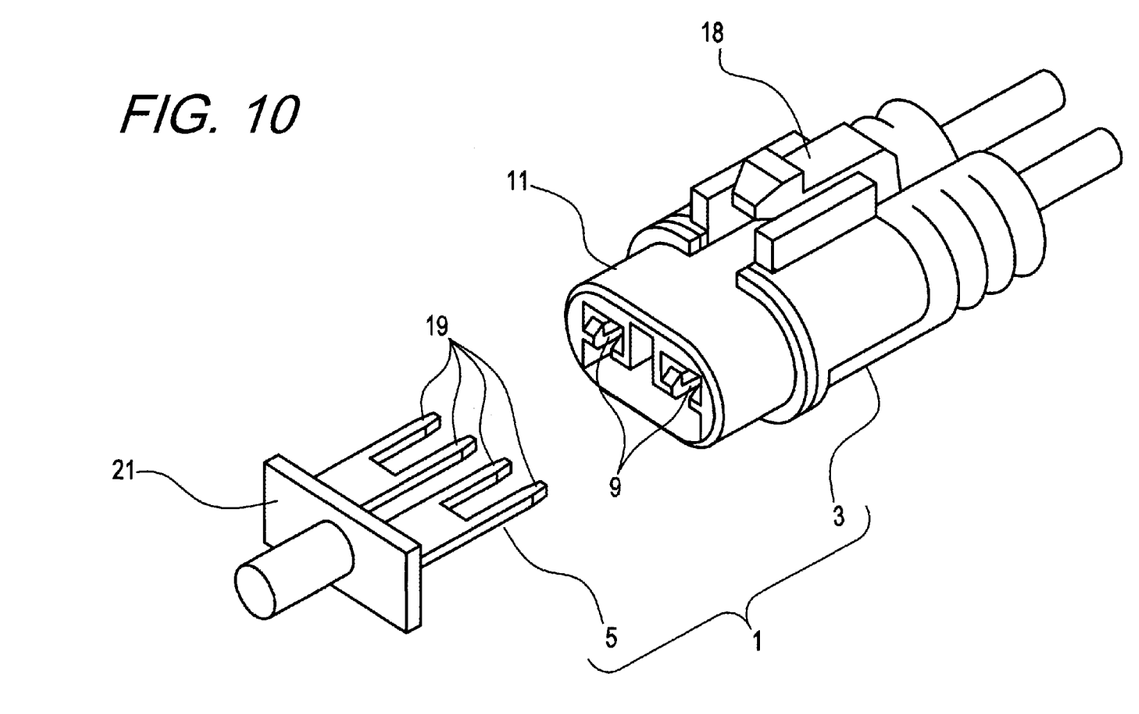
FIG. 10 is an outline perspective view of a conventional connector inspection system.
Figure 11:
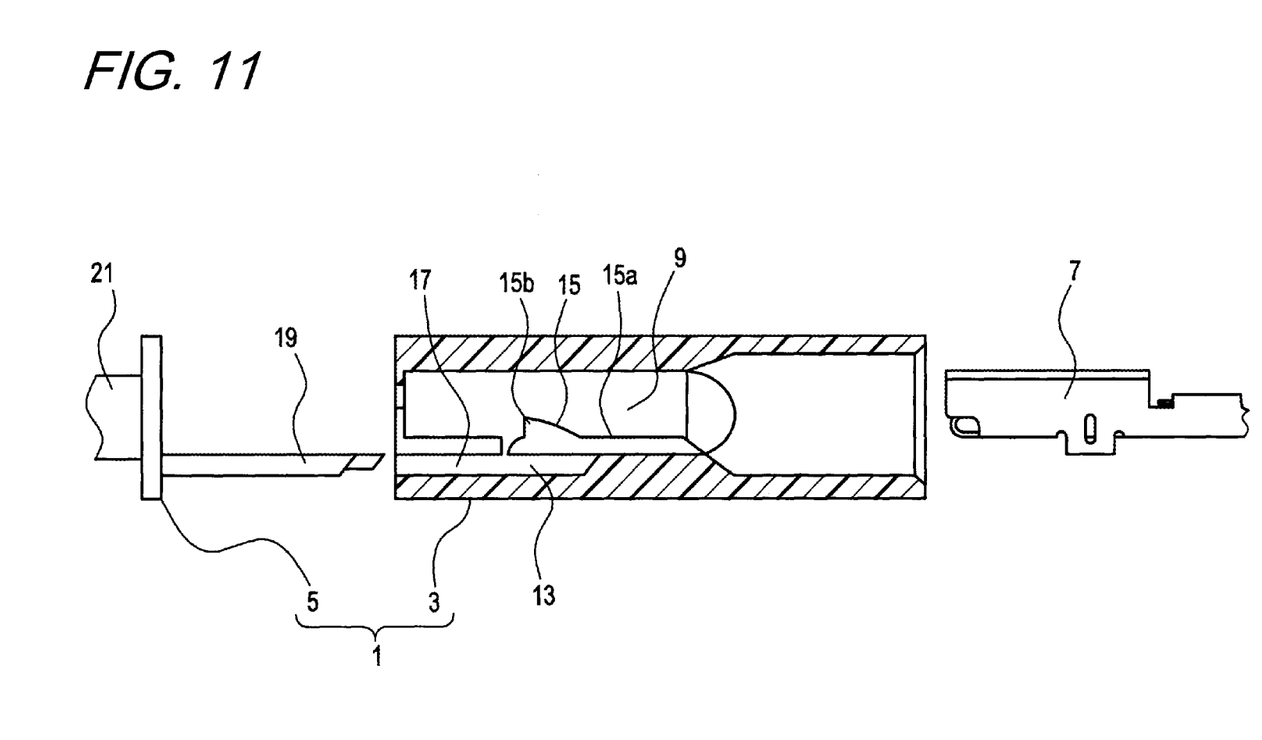
FIG. 11 is a longitudinal sectional view of a connector housing targeted for inspection of the conventional connector inspection system.
Figure 12:
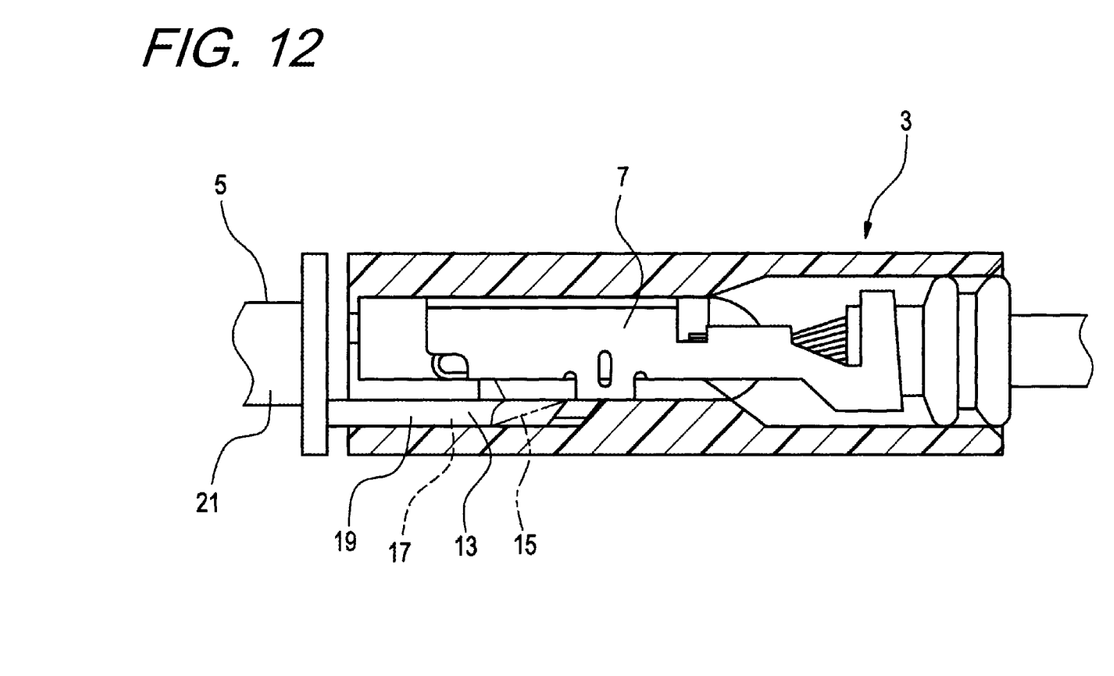
FIG. 12 is a longitudinal sectional view of a state of checking a state of insertion of a connecting terminal by the conventional connector inspection system.

FIGS. 10 to 12 show a conventional connector inspection system for detecting whether or not an attachment state of a connecting terminal in a connector housing is proper.

A connector inspection system 1 shown herein is disclosed in JP-A-7-296931, and includes a connector housing 3 to be inspected, and an inspection jig 5 attached to the front end side of the connector housing 3 as shown in FIG. 10.

The connector housing 3 includes a terminal receiving part 11 having a terminal receiving chamber 9 to which a connecting terminal 7 is inserted and attached, lance retraction space 13 mounted inside the terminal receiving part 11 adjacently to the terminal receiving chamber 9, a lance 15 for locking the connecting terminal 7 in which proper insertion into the terminal receiving chamber 9 is completed, a hole 17 for inspection, and a lock mechanism 18 for being joined to the other connector.

The lance 15 includes an elastic piece 15a extending along an insertion direction of the connecting terminal 7 in one side of the terminal receiving chamber 9, and a locking protrusion 15b protruding from a free end of the elastic piece 15a inside the terminal receiving chamber 9.

This lance 15 retracts in the lance retraction space 13 by elastic displacement by interference with the connecting terminal 7 during insertion of the connecting terminal 7 as shown in FIG. 12. Then, at the time of completing the insertion of the connecting terminal 7, the lance 15 returns from the lance retraction space 13 to the side of the terminal receiving chamber 9 by an elastic restoring force of the elastic piece 15a, and locks the connecting terminal 7.

The hole 17 for inspection extends through a front end wall of the terminal receiving part 11 along the insertion direction of the connecting terminal 7 and communicates with the lance retraction space 13 as shown in FIG. 11.

The inspection jig 5 includes plural detecting pins 19 capable of being inserted into the hole 17 for inspection, and a jig body 21 for supporting the plural detecting pins 19 in correspondence with an arrangement pitch of the hole 17 for inspection in the terminal receiving part 11 as shown in FIG. 10.

When the insertion of the connecting terminal 7 into the terminal receiving chamber 9 is incomplete (during the insertion) in the case of the connector inspection system 1 described above, the lance 15 is depressed to the side of the lance retraction space 13 by the connecting terminal 7 as shown in FIG. 12.

When the detecting pin 19 is inserted into the hole 17 for inspection in a state of the incomplete insertion of the connecting terminal 7 thus, during the insertion of the detecting pin 19, the top of the detecting pin 19 collides with the lance 15 and a length of the insertion of the detecting pin 19 into the hole 17 for inspection does not reach a prescribed length.

That is, the connector inspection system 1 described above detects whether or not an attachment state of the connecting terminal 7 in the connector housing 3 is proper by deciding whether or not the length of the insertion of the detecting pin 19 into the hole 17 for inspection reaches the prescribed length.

Figure 13:
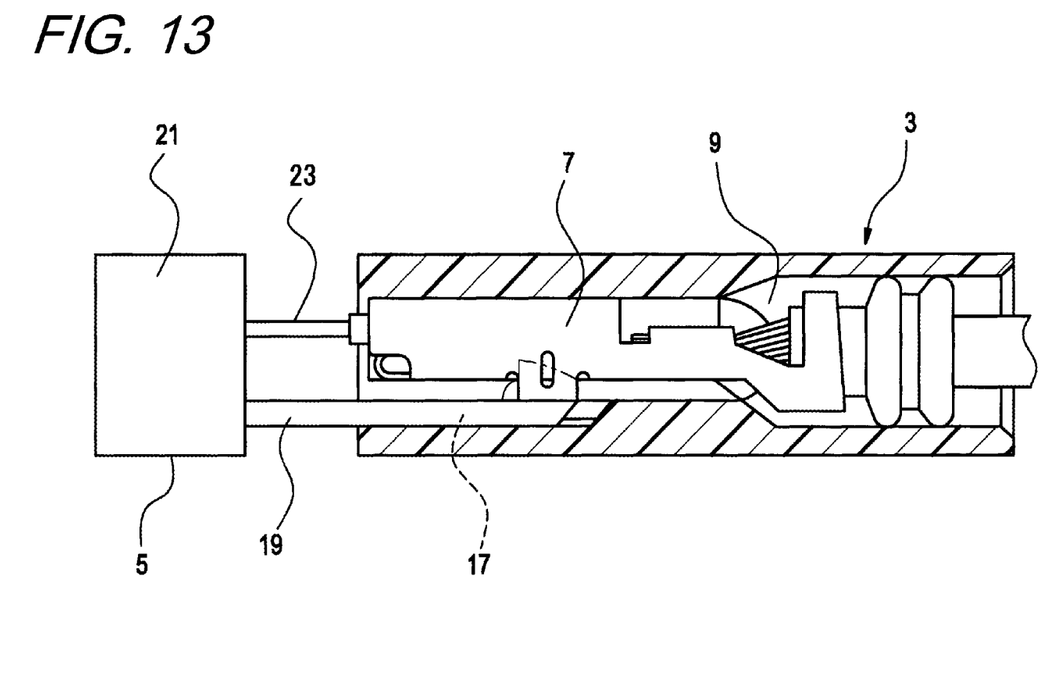
FIG. 13 is a longitudinal sectional view of a state of checking connection (continuity) of the connecting terminal by the conventional connector inspection system.

As the inspection jig 5 used in such a connector inspection system 1, an inspection jig which can perform a continuity test of the connecting terminal 7 and has a probe 23 for making contact with the connecting terminal 7 when the length of the insertion of the detecting pin 19 into the hole 17 for inspection reaches the prescribed length as shown in FIG. 13 is also proposed.

JP-A-7-296931 is discussed as a conventional art.

SUMMARY OF INVENTION

Technical Problems

However, the connector inspection system 1 described above has no guide mechanism for regulating an insertion position or an attitude of the inspection jig 5 to the connector housing 3 in a proper state when the detecting pin 19 of the inspection jig 5 is inserted into the hole 17 for inspection.

As a result, even when proper insertion of the connecting terminal 7 is completed, there was fear of false detection because at the time of insertion into the terminal receiving chamber 9, for example, the detecting pin 19 is horizontally or vertically inclined (swung) and inserted and thus the top of the detecting pin 19 catches on a recess etc. of the periphery of the hole 17 for inspection.

Hence, when there is a surface straight extending in an insertion direction of the connecting terminal 7 in an outer periphery of the connector housing 3, development of a dedicated guide mechanism for regulating a movement direction of the detecting pin 19 using the surface as a reference surface was examined. However, the development of the dedicated guide mechanism had a problem of increasing an inspection cost.

Also, normally, an outside diameter of the connector housing 3 is often formed of a curved line. Particularly in the case of a waterproof connector housing, in order to attach packing to an outer periphery of the terminal receiving part 11, the outer periphery of the terminal receiving part 11 is formed in a curved surface shape or an attachment surface of the packing is formed in an uneven structure and actually, it is extremely difficult to mount the guide mechanism later.

Hence, an object of the invention is to solve the problems described above, and is to provide a connector inspection system capable of easily and surely detecting whether or not an attachment state of a connecting terminal in a waterproof connector housing in which packing is attached to the proximal end side outer periphery of a terminal receiving part is proper.

Solution to Problems

The object of the invention is achieved by the following configuration.

(1) A connector inspection system for detecting whether or not an attachment state of a connecting terminal in a connector housing is proper by deciding whether or not a length of insertion of a detecting pin into a hole for inspection reaches a prescribed length, the system in which the connector housing to be inspected includes a terminal receiving part having a terminal receiving chamber to which the connecting terminal is inserted and attached, lance retraction space mounted inside the terminal receiving part adjacently to the terminal receiving chamber, a lance which retracts in the lance retraction space by elastic displacement by interference with the connecting terminal during insertion of the connecting terminal and returns from the lance retraction space by an elastic restoring force to lock the connecting terminal at the time of completing the insertion of the connecting terminal, and the hole for inspection for extending through a front end wall of the terminal receiving part along an insertion direction of the connecting terminal and communicating with the lance retraction space, and an inspection jig attached to a front end side of the connector housing includes the detecting pin capable of being inserted into the hole for inspection, characterized in that the connector housing includes a packing attachment surface formed on a proximal end side outer periphery of the terminal receiving part, and a reference flat surface formed by straight extending in the insertion direction of the connecting terminal in a top side outer peripheral region of the terminal receiving part so as not to overlap with a mounting range of the packing attachment surface, and the inspection jig includes a guide flat surface for slidably making surface contact with the reference flat surface in the case of inserting the detecting pin into the hole for inspection, and a position and a direction of insertion of the inspection jig into the connector housing are regulated by sliding contact between the reference flat surface and the guide flat surface.

(2) A connector inspection system as described in the above (1), characterized in that the reference flat surfaces are mounted in a total of four positions of two positions opposed to a first orthogonal axis direction orthogonal to the insertion direction of the connecting terminal in the top side outer peripheral region and two positions opposed to a second orthogonal axis direction intersecting with the first orthogonal direction and orthogonal to the insertion direction of the connecting terminal in the top side outer peripheral region, and the guide flat surfaces are respectively mounted in four positions opposed to mounting positions of the reference flat surfaces, and a position and a direction of insertion of the inspection jig into the connector housing are regulated by sandwiching the oppositely arranged reference flat surfaces between the oppositely arranged guide flat surfaces.

According to the configuration of the above (1), when the detecting pin of the inspection jig is inserted into the hole for inspection of the connector housing targeted for inspection, the guide flat surface included in the inspection jig slidably makes surface contact with the reference flat surface formed by straight extending in the top side outer peripheral region of the terminal receiving part of the connector housing, and the position and the direction of insertion of the inspection jig into the connector housing are regulated by sliding contact between the reference flat surface and the guide flat surface.

As a result, swing or inclination of the detecting pin can be prevented from occurring at the time of inserting the detecting pin. Therefore, trouble in which the top of the detecting pin catches on the middle of the hole for inspection due to the swing or inclination of the detecting pin does not occur, and false detection can be prevented from occurring.

Also, a movement operation of the detecting pin is smoothed by the sliding contact between the reference flat surface and the guide flat surface, so that a manipulation of insertion is facilitated.

Also, the reference flat surface of the connector housing is formed in the top side outer peripheral region of the terminal receiving part so as not to overlap with the mounting range of the packing attachment surface formed on the proximal end side outer periphery of the terminal receiving part.

As a result, mounting of the reference flat surface does not affect waterproof properties or attachment properties of the packing.

Therefore, the connector inspection system capable of easily and surely detecting whether or not the attachment state of the connecting terminal in the waterproof connector housing in which the packing is attached to the proximal end side outer periphery of the terminal receiving part is proper can be provided.

According to the configuration of the above (2), position regulation by sliding contact between the reference flat surfaces and the guide flat surfaces is performed in four positions of the periphery of the terminal receiving part, and these four positions are arranged as opposed to the orthogonal axis directions orthogonal to the insertion direction of the connecting terminal, and movement of four directions orthogonal to the insertion direction of the connecting terminal can be regulated with respect to the detecting pin and the movement operation of the detecting pin can be performed extremely accurately.

Advantageous Effect of the Invention

According to the connector inspection system according to the invention, when the detecting pin of the inspection jig is inserted into the hole for inspection of the connector housing targeted for inspection, the guide flat surface included in the inspection jig slidably makes surface contact with the reference flat surface formed by straight extending in the top side outer peripheral region of the terminal receiving part of the connector housing, and the position and the direction of insertion of the inspection jig into the connector housing are regulated by sliding contact between the reference flat surface and the guide flat surface.

As a result, swing or inclination of the detecting pin can be prevented from occurring at the time of inserting the detecting pin. Therefore, trouble in which the top of the detecting pin catches on the middle of the hole for inspection due to the swing or inclination of the detecting pin does not occur, and false detection can be prevented from occurring.

Also, a movement operation of the detecting pin is smoothed by the sliding contact between the reference flat surface and the guide flat surface, so that a manipulation of insertion is facilitated.

Also, the reference flat surface of the connector housing is formed in the top side outer peripheral region of the terminal receiving part so as not to overlap with the mounting range of the packing attachment surface formed on the proximal end side outer periphery of the terminal receiving part.

As a result, mounting of the reference flat surface does not affect waterproof properties or attachment properties of the packing.

Therefore, the connector inspection system capable of easily and surely detecting whether or not the attachment state of the connecting terminal in the waterproof connector housing in which the packing is attached to the proximal end side outer periphery of the terminal receiving part is proper can be provided.

DESCRIPTION OF EMBODIMENTS

A preferred embodiment of a connector inspection system according to the invention will hereinafter be described in detail with reference to the drawings.

Figure 1:
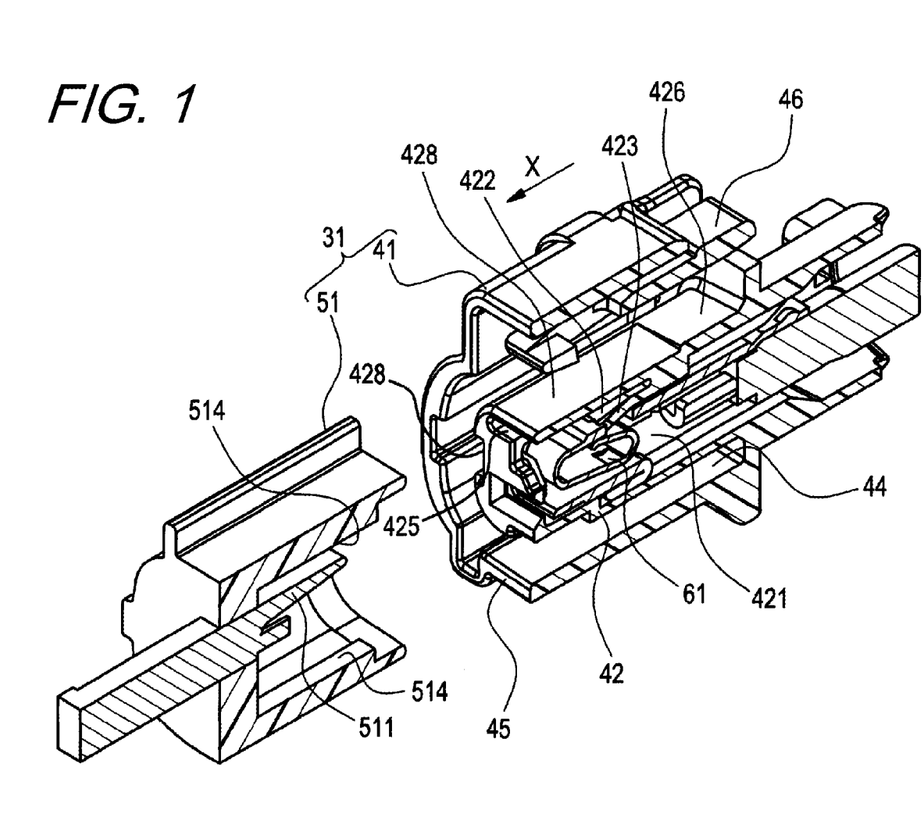
FIG. 1 is a perspective view of one embodiment of a connector inspection system according to the invention.
Figure 2:
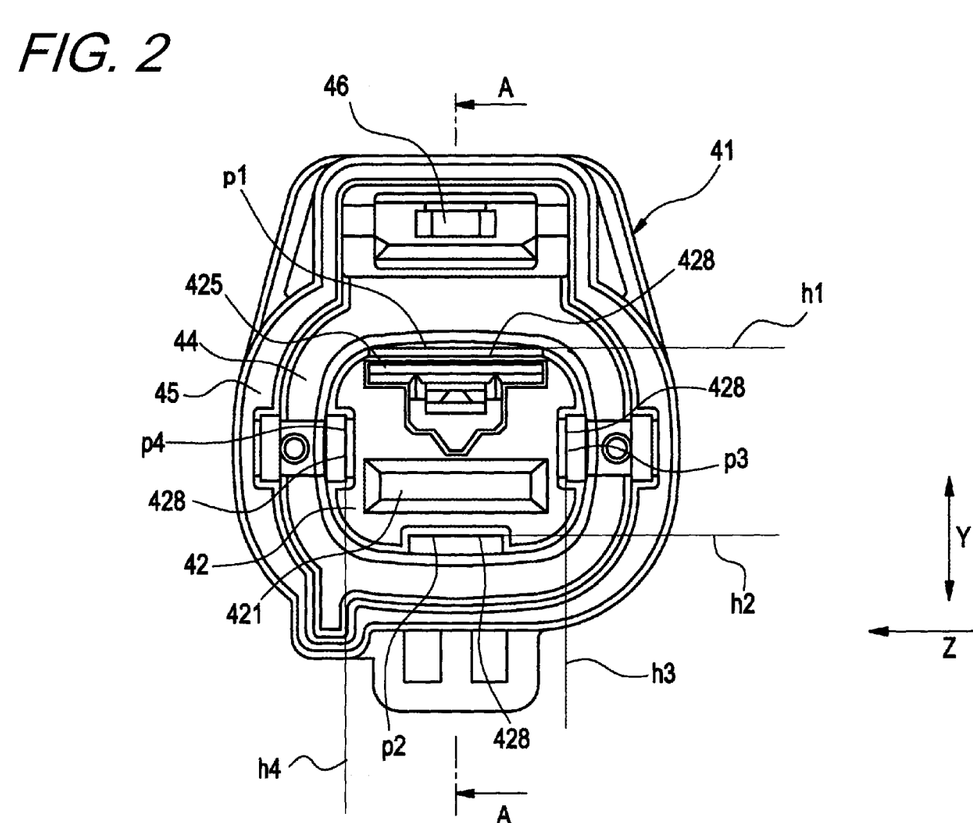
FIG. 2 is a front view of a connector housing shown in FIG. 1.
Figure 3:
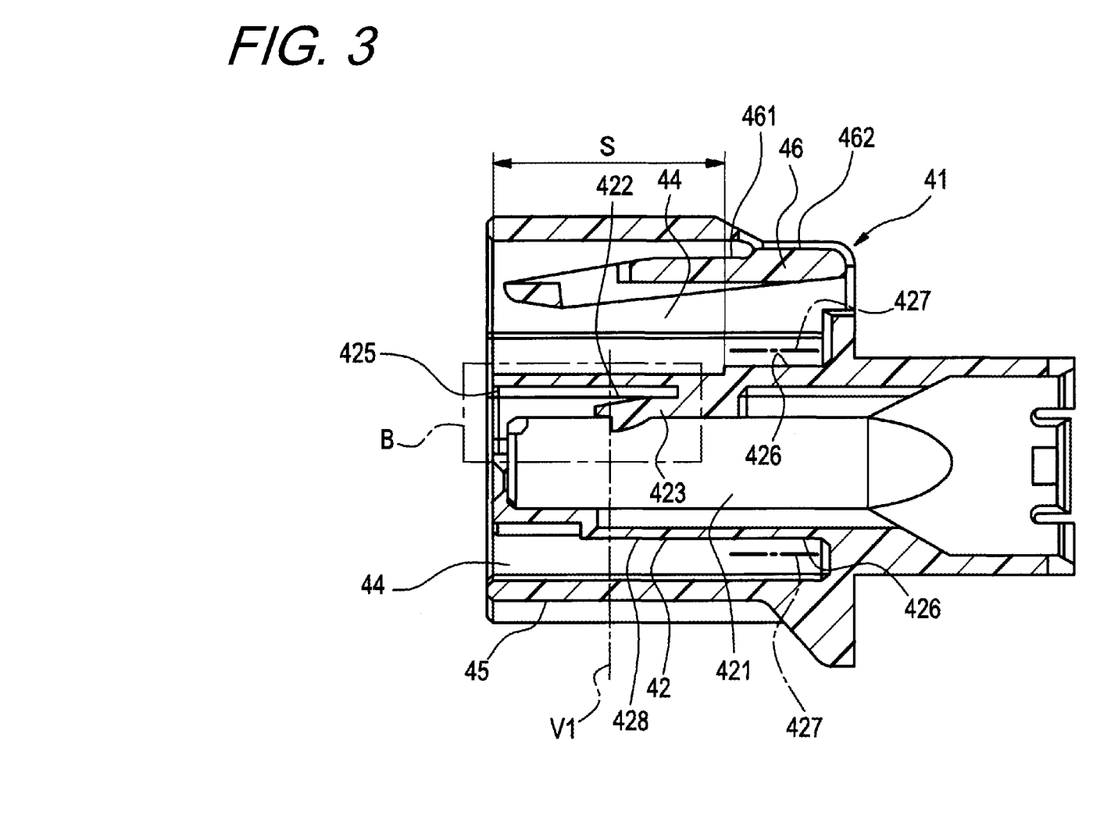
FIG. 3 is a sectional view taken on line A-A of FIG. 2.
Figure 4:
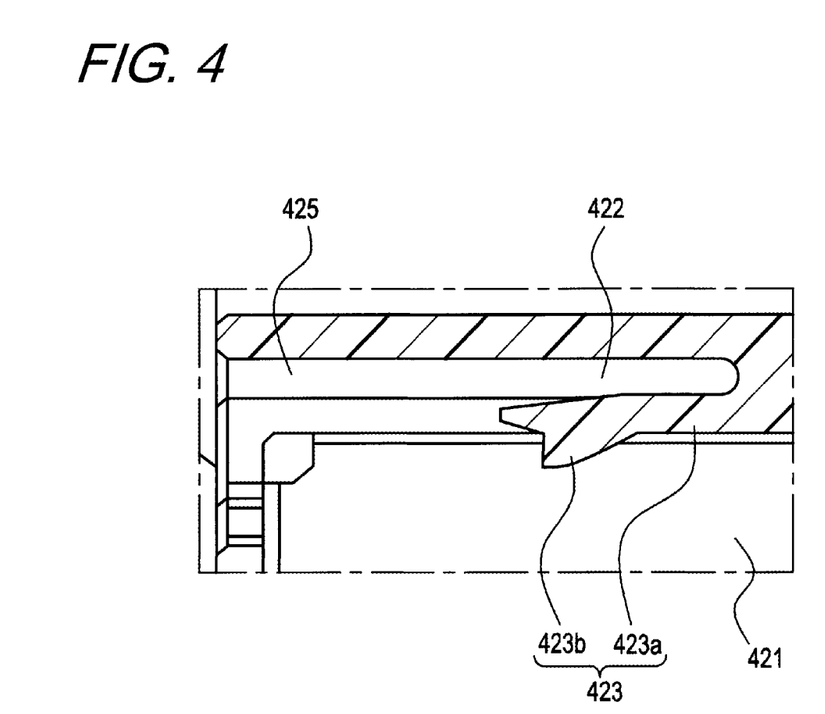
FIG. 4 is an enlarged view of a part B of FIG. 3.
Figure 5:
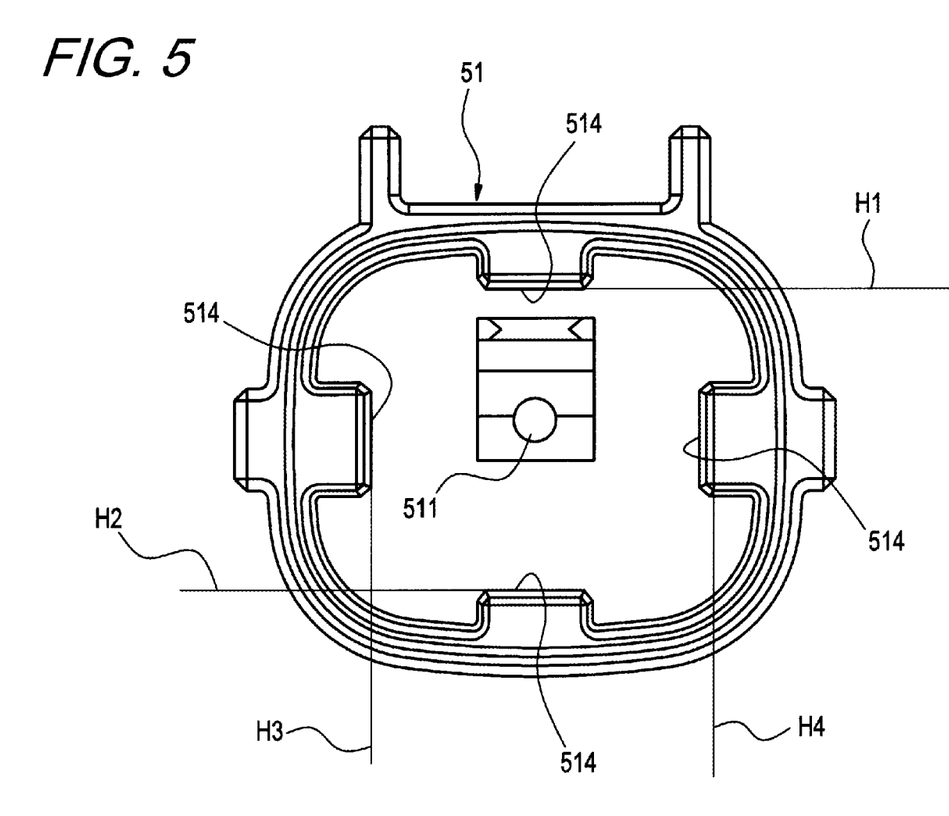
FIG. 5 is a front view of an inspection jig shown in FIG. 1.
Figure 6:
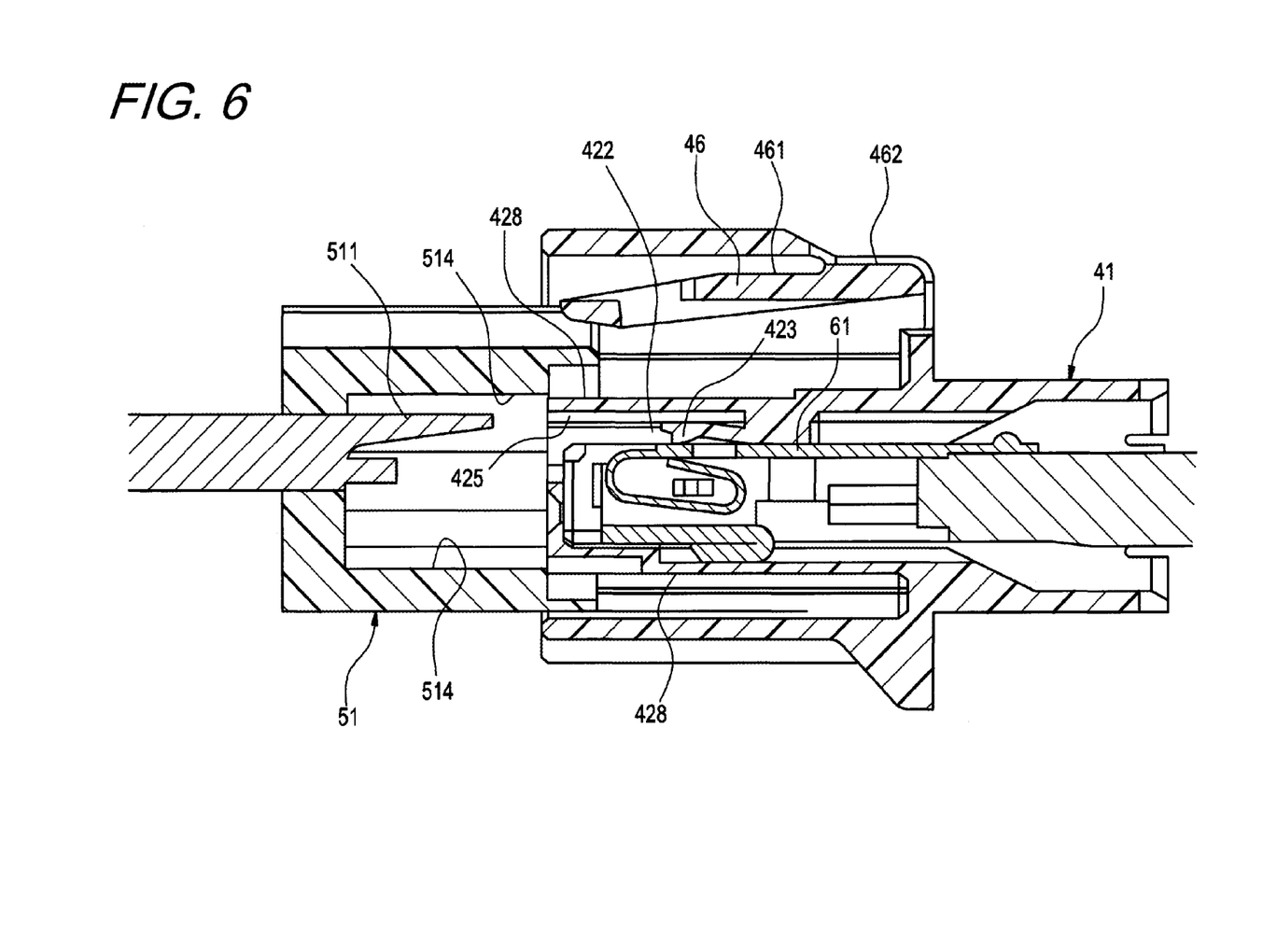
FIG. 6 is a longitudinal sectional view of a state of starting to attach the inspection jig to the front end of the connector housing shown in FIG. 1.
Figure 7:
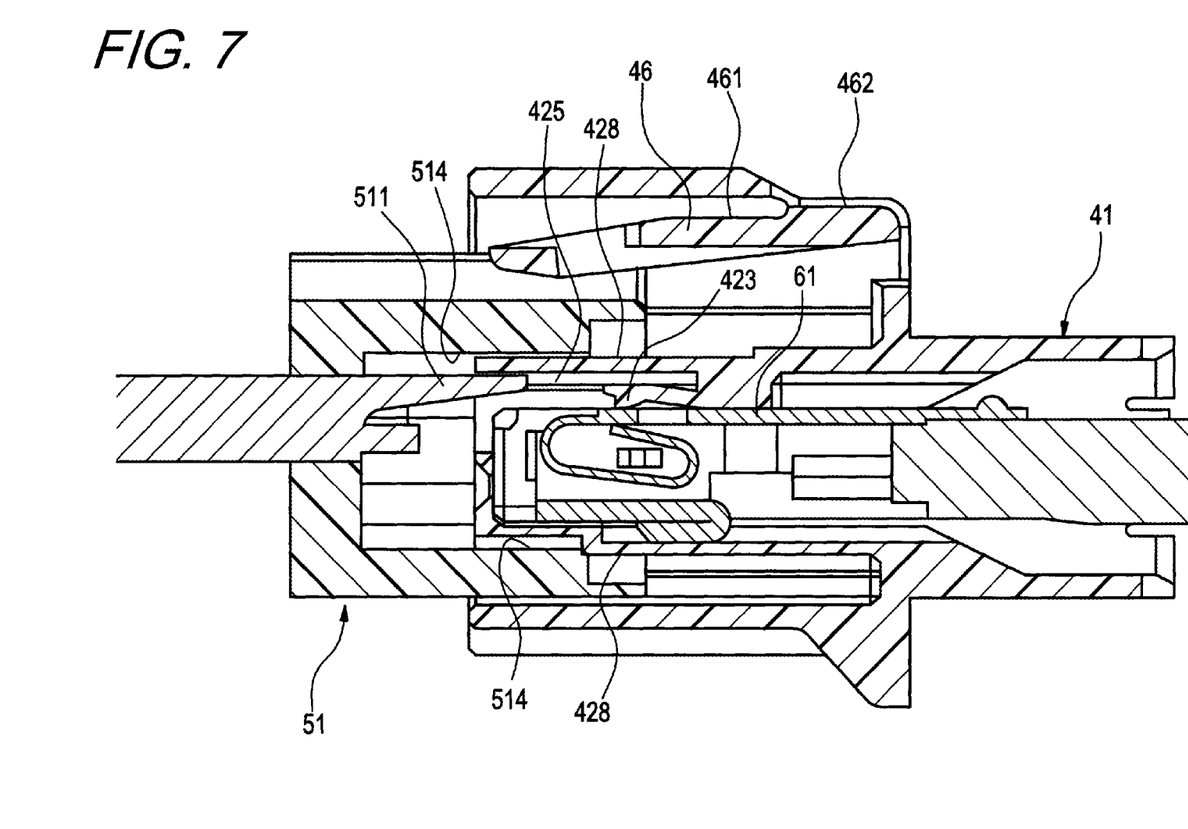
FIG. 7 is a longitudinal sectional view showing a state of the middle of insertion of a detecting pin of the inspection jig into a hole for inspection.
Figure 8:
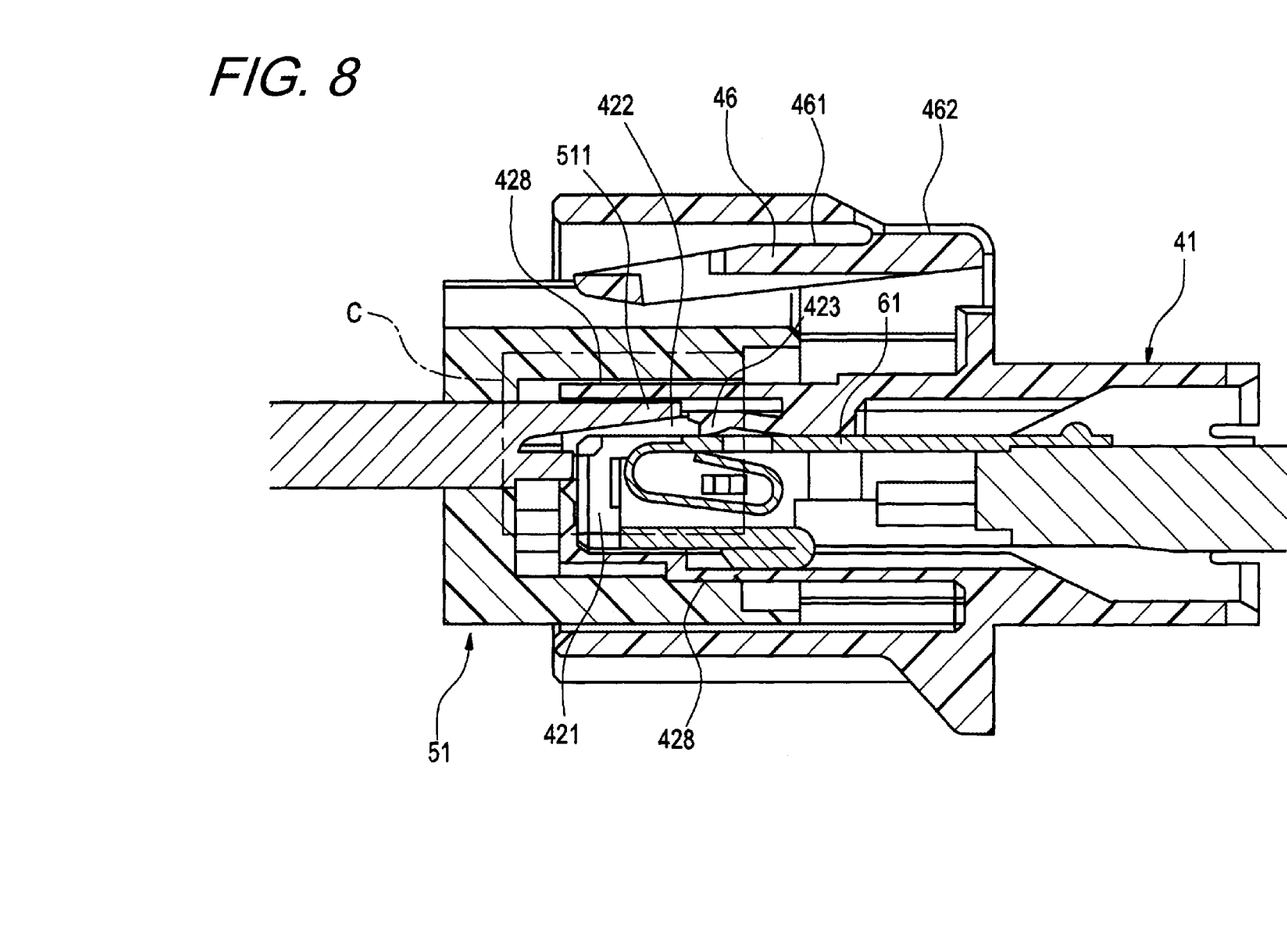
FIG. 8 is a longitudinal sectional view of a state of completing insertion of the detecting pin of the inspection jig into the hole for inspection.
Figure 9:
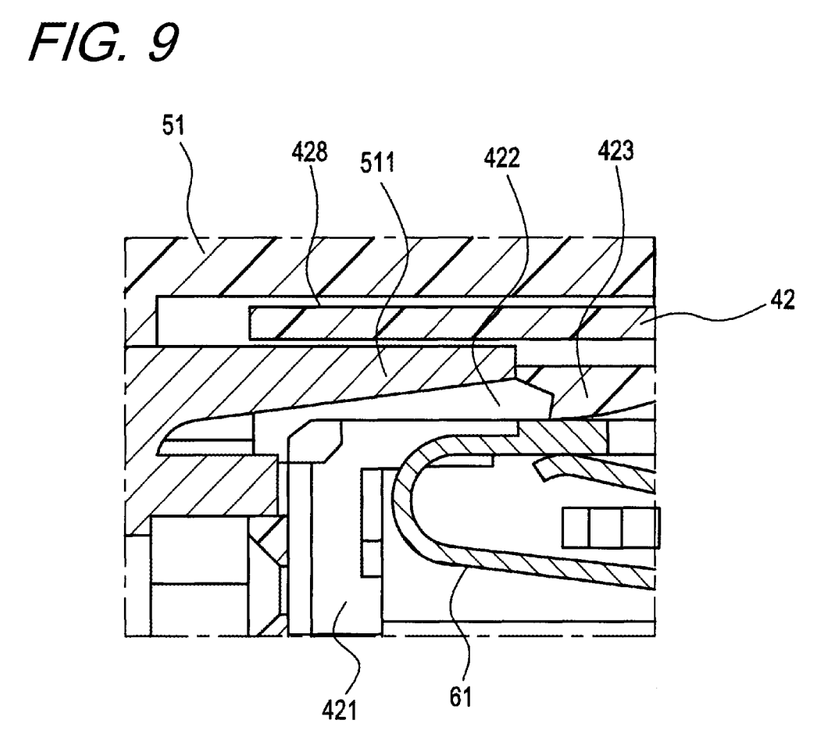
FIG. 9 is an enlarged view of a part C of FIG. 8.

FIGS. 1 to 9 show one embodiment of the connector inspection system according to the invention, and FIG. 1 is a perspective view of one embodiment of the connector inspection system according to the invention, and FIG. 2 is a front view of a connector housing shown in FIG. 1, and FIG. 3 is a sectional view taken on line A-A of FIG. 2, and FIG. 4 is an enlarged view of a part B of FIG. 3, and FIG. 5 is a front view of an inspection jig shown in FIG. 1, and FIG. 6 is a longitudinal sectional view of a state of starting to attach the inspection jig to the front end of the connector housing shown in FIG. 1, and FIG. 7 is a longitudinal sectional view showing a state of the middle of insertion of a detecting pin of the inspection jig into a hole for inspection, and FIG. 8 is a longitudinal sectional view of a state of completing insertion of the detecting pin of the inspection jig into the hole for inspection, and FIG. 9 is an enlarged view of a part C of FIG. 8.

A connector inspection system 31 of this embodiment includes a connector housing 41 to be inspected, and an inspection jig 51 attached to the front end side of the connector housing 41 as shown in FIG. 1.

The connector housing 41 has a terminal receiving part 42, a hood part 45 for forming fitting space 44 in the periphery of the terminal receiving part 42, and a lock member 46 as shown in FIGS. 1 to 3.

The terminal receiving part 42 includes a terminal receiving chamber 421 to which a connecting terminal 61 is inserted and attached, lance retraction space 422, a lance 423, and a hole 425 for inspection.

The terminal receiving chamber 421 extends through a fitting direction (a direction of arrow X in FIG. 1) into the other connector housing and is provided. In the case of the present embodiment, the number of terminal receiving chambers 421 mounted in the terminal receiving part 42 is one. That is, the connector housing 41 is a single-pole connector housing.

The lance retraction space 422 is space in which the lance 423 retracts when the connecting terminal 61 is inserted into the terminal receiving chamber 421. The lance retraction space 422 is mounted inside the terminal receiving part 42 adjacently to the terminal receiving chamber 421.

The lance 423 includes an elastic piece 423a extending along an insertion direction of the connecting terminal 61 in one side (upper side in FIG. 4) of the terminal receiving chamber 421, and a locking protrusion 423b protruding from a free end of the elastic piece 423a inside the terminal receiving chamber 421.

This lance 423 retracts in the lance retraction space 422 by elastic displacement by interference with the connecting terminal 61 during insertion of the connecting terminal 61 as shown in FIG. 6. Then, at the time of completing the insertion of the connecting terminal 61, the lance 423 returns from the lance retraction space 422 to the side of the terminal receiving chamber 421 by an elastic restoring force of the elastic piece 423a, and locks the connecting terminal 61. A vertical line V1 shown in FIG. 3 shows a locking position by the lance 423.

The hole 425 for inspection extends through a front end wall of the terminal receiving part 42 along the insertion direction of the connecting terminal 61 and communicates with the lance retraction space 422 as shown in FIGS. 2 and 4.

The fitting space 44 formed in the periphery of the terminal receiving part 42 by the hood part 45 is space into which a hood part of the other connector housing is fitted.

The lock member 46 mounts a locking part 462 in the top of an elastic arm 461. The lock member 46 locks the other connector housing by engaging the locking part 462 with an engaging part formed in the hood part of the other connector housing entering the fitting space 44.

The connector housing 41 of the embodiment is used as a waterproof connector and as shown in FIG. 3, a packing attachment surface 426 is formed on the proximal end side outer periphery of the terminal receiving part 42 facing the fitting space 44. In FIG. 3, a mounting range (range in which packing is attached) 427 of the packing attachment surface 426 is shown by a thick chain line.

The connector housing 41 of the embodiment includes a reference flat surface 428 in a top side outer peripheral region S of the terminal receiving part 42 so as not to overlap with the mounting range of the packing attachment surface 426 shown in FIG. 3.

The reference flat surface 428 is a flat surface formed by straight extending in the insertion direction of the connecting terminal 61. In the case of the embodiment, the reference flat surfaces 428 are mounted in a total of four positions of two positions p1, p2 opposed to a first orthogonal axis direction (a direction of arrow Y in FIG. 2) orthogonal to the insertion direction of the connecting terminal 61 in the top side outer peripheral region S and two positions p3, p4 opposed to a second orthogonal axis direction (a direction of arrow Z in FIG. 2) intersecting with the first orthogonal direction and orthogonal to the insertion direction of the connecting terminal 61 in the top side outer peripheral region S as shown in FIG. 2.

In addition, in FIG. 2, flat surface position indication lines h1, h2, h3 and h4 are written in order to clarify a position and an angle of each of the reference flat surfaces 428. These flat surface position indication lines h1, h2, h3 and h4 are extended lines of the respective flat surfaces.

Next, the inspection jig 51 of the embodiment will be described.

The inspection jig 51 includes a detecting pin 511 and a guide flat surface 514 as shown in FIG. 1.

The detecting pin 511 is a protrusion capable of being inserted into the hole 425 for inspection. A protrusion length of the detecting pin 511 is set longer than a length from the vertical line V1 shown in FIG. 3 to a front end surface of the connector housing 41 so as to collides with the lance 423 when the lance 423 retracts in the hole 425 for inspection.

The guide flat surface 514 is a surface for slidably making surface contact with the reference flat surface 428 of the outer periphery of the terminal receiving part 42 in the case of inserting the detecting pin 511 into the hole 425 for inspection. In the case of the embodiment, the guide flat surfaces 514 are respectively mounted in four positions opposed to the mounting positions of the reference flat surfaces 428 on the terminal receiving part 42 as shown in FIG. 5.

In addition, in FIG. 5, flat surface position indication lines H1, H2, H3 and H4 are written in order to clarify a position and an angle of each of the guide flat surfaces 514. These flat surface position indication lines H1, H2, H3 and H4 are extended lines of the respective flat surfaces.

In the inspection jig 51 of the embodiment, a position and a direction of insertion of the inspection jig 51 into the connector housing 41 are regulated by sandwiching the reference flat surfaces 428 oppositely arranged in the side of the connector housing 41 between the guide flat surfaces 514 oppositely arranged in the side of the inspection jig 51 when the detecting pin 511 is inserted into the hole 425 for inspection.

The connector inspection system 31 described above detects whether or not an attachment state of the connecting terminal 61 in the connector housing 41 is proper by deciding whether or not a length of insertion of the detecting pin 511 into the hole 425 for inspection reaches a prescribed length.

An operation of the case of inserting the detecting pin 511 of the inspection jig 51 into the hole 425 for inspection of the connector housing 41 and detecting poor attachment of the connecting terminal 61 of the inside of the connector housing 41 will be described based on FIGS. 6 to 9. In addition, in FIGS. 6 to 9, the connecting terminal 61 of the inside of the connector housing 41 is in a state of poor attachment, and the lance 423 is in a state of protruding to the lance retraction space 422.

First, as shown in FIG. 6, the detecting pin 511 of the inspection jig 51 is opposed to the hole 425 for inspection of the connector housing 41 and a manipulation of insertion is started. Only in the case of aligning respective positions of the reference flat surfaces 428 and the guide flat surfaces 514 as well as positions of the detecting pin 511 and the hole 425 for inspection with respect to the connector housing 41 and the inspection jig 51 at this time, the inspection jig 51 can be fitted into the connector housing 41.

As shown in FIG. 7, swing of the inspection jig 51 is regulated by sliding between the guide flat surfaces 514 and the reference flat surfaces 428 when the top of the detecting pin 511 is inserted into the hole 425 for inspection, so that the detecting pin 511 is not inserted obliquely and the detecting pin 511 can smoothly be inserted into the hole 425 for inspection.

Then, in the case of the illustrated example, the lance 423 protrudes to the lance retraction space 422, so that as shown in FIGS. 8 and 9, the top of the detecting pin 511 collides with the lance 423 before the detecting pin 511 is inserted to a primary insertion depth, and further insertion is disabled.

Then, the insertion depth of the detecting pin 511 does not reach a prescribed value, so that it is detected that insertion of the connecting terminal 61 is incomplete.

In the connector inspection system 31 of one embodiment described above, when the detecting pin 511 of the inspection jig 51 is inserted into the hole 425 for inspection of the connector housing 41 targeted for inspection, the guide flat surfaces 514 included in the inspection jig 51 slidably make surface contact with the reference flat surfaces 428 formed by straight extending in the top side outer peripheral region S of the terminal receiving part 42 of the connector housing 41, and the position and the direction of insertion of the inspection jig 51 into the connector housing 41 are regulated by sliding contact between the reference flat surfaces 428 and the guide flat surfaces 514.

As a result, swing or inclination of the detecting pin 511 can be prevented from occurring at the time of inserting the detecting pin 511. Therefore, trouble in which the top of the detecting pin 511 catches on the middle of the hole 425 for inspection due to the swing or inclination of the detecting pin 511 does not occur, and false detection can be prevented from occurring.

Also, a movement operation of the detecting pin 511 is smoothed by the sliding contact between the reference flat surfaces 428 and the guide flat surfaces 514, so that the manipulation of insertion is facilitated.

Also, the reference flat surfaces 428 of the connector housing 41 are formed in the top side outer peripheral region S of the terminal receiving part 42 so as not to overlap with the mounting range of the packing attachment surface 426 formed on the proximal end side outer periphery of the terminal receiving part 42.

As a result, mounting of the reference flat surfaces 428 does not affect waterproof properties or attachment properties of the packing.

Therefore, the connector inspection system 31 capable of easily and surely detecting whether or not an attachment state of the connecting terminal 61 in the waterproof connector housing 41 in which the packing is attached to the proximal end side outer periphery of the terminal receiving part 42 is proper can be provided.

Also, in the connector inspection system 31 of one embodiment described above, position regulation by sliding contact between the reference flat surfaces 428 and the guide flat surfaces 514 is performed in four positions of the periphery of the terminal receiving part 42, and these four positions are arranged as opposed to the orthogonal axis directions orthogonal to the insertion direction of the connecting terminal 61, and movement of four directions orthogonal to the insertion direction of the connecting terminal 61 can be regulated with respect to the detecting pin 511 and the movement operation of the detecting pin 511 can be performed extremely accurately.

In addition, the connector inspection system of the invention is not limited to each of the embodiments described above, and appropriate modifications, improvements, etc. can be made.

For example, a mounting position or the number of reference flat surfaces mounted in the connector housing and a mounting position or the number of guide flat surfaces mounted in the inspection jig may be set at the position or the number different from those of the embodiment described above.

INDUSTRIAL APPLICABILITY

According to the connector inspection system according to the invention, when the detecting pin of the inspection jig is inserted into the hole for inspection of the connector housing targeted for inspection, the guide flat surface included in the inspection jig slidably makes surface contact with the reference flat surface formed by straight extending in the top side outer peripheral region of the terminal receiving part of the connector housing, and the position and the direction of insertion of the inspection jig into the connector housing are regulated by sliding contact between the reference flat surface and the guide flat surface.

The present application is based on Japanese Patent Application No. 2010-163085, filed on Jul. 20, 2010, the entire contents of which are herein incorporated by reference.

The invention claimed is:

1. A connector inspection system for detecting whether or not an attachment state of a connecting terminal in a connector housing is proper by deciding whether or not a length of insertion of a detecting pin into a hole for inspection reaches a prescribed length, the system in which the connector housing to be inspected includes a terminal receiving part having a terminal receiving chamber to which the connecting terminal is inserted and attached, lance retraction space mounted inside the terminal receiving part adjacently to the terminal receiving chamber, a lance which retracts in the lance retraction space by elastic displacement by interference with the connecting terminal during insertion of the connecting terminal and returns from the lance retraction space by an elastic restoring force to lock the connecting terminal at the time of completing the insertion of the connecting terminal, and the hole for inspection for extending through a front end wall of the terminal receiving part along an insertion direction of the connecting terminal and communicating with the lance retraction space, and an inspection jig attached to a front end side of the connector housing includes the detecting pin capable of being inserted into the hole for inspection, wherein the connector housing includes a packing attachment surface formed on a proximal end side outer periphery of the terminal receiving part, and a reference flat surface formed by straight extending in the insertion direction of the connecting terminal in a top side outer peripheral region of the terminal receiving part so as not to overlap with a mounting range of the packing attachment surface, and the inspection jig includes a guide flat surface for slidably making surface contact with the reference flat surface in the case of before inserting the detecting pin into the hole for inspection, and a position and a direction of insertion of the inspection jig into the connector housing are regulated by sliding contact between the reference flat surface and the guide flat surface.

2. A connector inspection system as claimed in claim 1, characterized in that the reference flat surfaces are mounted in a total of four positions of two positions opposed to a first orthogonal axis direction orthogonal to the insertion direction of the connecting terminal in the top side outer peripheral region and two positions opposed to a second orthogonal axis direction intersecting with the first orthogonal direction and orthogonal to the insertion direction of the connecting terminal in the top side outer peripheral region, and the guide flat surfaces are respectively mounted in four positions opposed to mounting positions of the reference flat surfaces, and a position and a direction of insertion of the inspection jig into the connector housing are regulated by sandwiching the oppositely arranged reference flat surfaces between the oppositely arranged guide flat surfaces.

* * * * *